United States Patent
Navabi

[11] Patent Number: 5,994,923
[45] Date of Patent: Nov. 30, 1999

[54] CORRECTABLE OUTPUT DRIVER AND METHOD OF USING THE SAME

[75] Inventor: Mohammad J. Navabi, Austin, Tex.

[73] Assignee: Cypress Semiconductor Corp., San Jose, Calif.

[21] Appl. No.: 08/947,250

[22] Filed: Oct. 8, 1997

[51] Int. Cl.[6] .............................................. H03K 19/0175
[52] U.S. Cl. .............................................. 326/89; 326/31
[58] Field of Search ................................. 326/89, 83–84, 326/31–34, 115, 126, 127

[56] References Cited

U.S. PATENT DOCUMENTS 4,980,579  12/1990  McDonald et al. ..................... 307/455
5,465,057  11/1995  Takahashi ................................. 326/66

*Primary Examiner*—Michael Tokar
*Assistant Examiner*—Peguy JeanPierre
*Attorney, Agent, or Firm*—Kevin L. Daffer; Conley, Rose & Tayon

[57] ABSTRACT

A driver circuit is presented which can transition between output voltage levels at a high switching speed. The preferred output driver is a PECL driver having both a correction circuit portion and a drive circuit portion. The correction circuit senses changes in the base-to-emitter forward bias voltage $V_{BE}$ of drive transistors within the drive circuit. Thus, any change in performance of those drive transistors is replicated in the correction circuit, which then produces a compensating current. The compensating current is modulated by a reference voltage value, and mirrored to the drive circuit. The drive circuit includes not only differential input transistors and differential drive transistors, but also a resistor coupled to the base terminal of each drive transistor. The resistor receives the compensating current which then offsets any change in voltage level ($V_{OH}$ or $V_{OL}$) produced at the output of the drive transistors. The compensating current and specifically the compensating current as reflected upon the drive transistor outputs offset any dependence upon the forward bias voltage of the drive transistor caused by, for example, temperature or fabrication skews.

19 Claims, 3 Drawing Sheets

5,994,923

CORRECTABLE OUTPUT DRIVER AND METHOD OF USING THE SAME

BACKGROUND OF THE INVENTION

1. Field of the Invention

This invention relates to an electronic circuit and, more particularly, to an output driver circuit which produces relatively constant output logic levels between logic transitions despite process variations and changes in temperature.

2. Description of the Related Art

The form and function of emitter-coupled logic ("ECL") is generally well known. Typical ECL involves a bipolar form of logic, whereby the bipolar transistors are arranged so that they do not generally operate at saturation. ECL enjoys a high input impedance, rapid switching speed and low output impedance compared to other logic families. The ECL $V_{DD}$ and $V_{EE}$ conductors have traditionally been powered from a negative power supply, where $V_{DD}$ is grounded. In more recent designs, however, ECL is often used with a positive power supply. In this instance, $V_{DD}$ is generally set at a positive voltage and $V_{EE}$ is tied to ground. Positive ECL designs are often times referred to as positive- or pseudo-ECL ("PECL"). A benefit of PECL is its compatibility with standard logic supplies, such as those found in metal oxide semiconductors ("MOS") technology.

As clock speeds rise beyond 100 MHz, the advantages of using PECL become more obvious. For example, PECL can be employed within an output driver circuit to produce high speed output signals. The speed of those signals make them well suited as a clocking source or as serial link transmitted signals, if applied in the complementary form.

A clocking signal or a transmission signal must switch rapidly in modern computer and/or communication systems. Using a communication system as an example, a PECL driver is well suited for transferring ECL complementary (i.e., hereinafter "differential") outputs across a transmission medium such as a high-speed serial link comprising fiber, coax, or twisted pair. A CY7B923 transmitter obtainable from Cypress Semiconductor Corp., includes a PECL output driver capable of transferring data over a serial link at rates exceeding 160 Mbits/second.

FIG. 1 depicts a typical communication system linked by a serial bus (i.e., serial link) which is driven by a high speed PECL driver. Differential signals (OUTA and OUTA') output from transmitter 12 of communication system 10 are less susceptible to ground noise problems than, for example, single-ended MOS outputs since noise in differential PECL signals exists on both signals and becomes "common-mode". Common-mode noise is known to be more easily removable than many other types of noise. In addition, output driver 14 within transmitter 12 produces less noise as seen by the power supply. Namely, when one output drive transistor is on, the other output driver transistor is off. This ensures a constant current supply draw regardless of which output state is being produced.

Further illustrated in FIG. 1, and forming a part of transmitter 12 is an encoder 16 which encodes parallel bytes received by transmitter 12 and converts those encoded bytes into a serial stream of bits via serializer 18. The serial bit stream is then presented in complementary form across a serial link 20. Termination resistors 22 can be coupled at or near the receiver 24. Receiver 24 can therefore de-serialize and decode the serial bit stream as shown by blocks 26 and 28.

FIG. 1 illustrates only one example in which a PECL circuit is used. However, it is understood that the speed at which the PECL output signal transitions is equally suited for any application which requires high speed switching. Therefore, the PECL circuit 29 shown in FIG. 2, while suitable as an output driver 14, is nonetheless applicable to any high speed output driver which utilizes differential output signals.

Differential binary signals are defined as the difference between two outputs at dissimilar logic values. Thus, when signal OUTA is at a logic "1" or "high" value, then output OUTA' is at a logic "0" or logic "low" value. At other times, output OUTA' is at a logic high value, while output OUTA is at a logic low value. The logic high value produced at the output of circuit 29 in FIG. 2 is often referred to as $V_{OH}$, while the logic low value from circuit 29 is deemed $V_{OL}$.

FIG. 2 illustrates one example of a PECL output driver 29. The performance of first and second drive transistors 31 and 33 can substantially vary depending on their operating temperature and the methodology in which they were made. For example, an increase in operating temperature will decrease the base-to-emitter forward bias voltage ("$V_{BE}$") of transistors 31 and 33. $V_{BE}$ is a well known parameter which typically characterizes a bipolar transistor's performance and is generally defined as a voltage, which, when exceeded, will cause current to flow from the base to the emitter and, more importantly, activation of current from the collector to the emitter. $V_{BE}$ can also vary based on the parameters used to fabricate transistors 31 and 33. As those parameters change, or as temperature changes, the performance of the transistors correspondingly changes as evidenced by a change in $V_{BE}$. There may be numerous processing parameters which might vary to effect that change such as, for example, doping concentrations. It is generally recognized, for example, that for every 1° C. increase in temperature, the forward bias voltage from the base-to-emitter (i.e., $V_{BE}$) will decrease approximately 2.0 mV. A decrease in $V_{BE}$ will affect the performance of output driver 29.

PECL output driver 29 includes a pair of differential inputs (INA and INA') forwarded to a corresponding pair of npn bipolar transistors 35 and 37. If, for example, input INA' is at a logic high value (i.e., a voltage value which permits significant current flow from the collector to the emitter of transistor 35) then the amount of current flow will be equal to that sourced by current source 39. The sourced current is labeled $I_{DIFF}$. Current $I_{DIFF}$ will traverse the collector and emitter of transistor 35, but will not traverse transistor 37 since the complimentary input INA is at a low logic value causing transistor 37 to remain in a "off" state. In this case the output voltage at node OUTA will be at the low logic level, while the output voltage at node OUTA' will be at the high logic level. The output logic levels are described by the following equations which clearly demonstrate the dependence of $V_{OH}$ and $V_{OL}$ on $V_{BE}$:

$$V_{OH}=V_{DD}-V_{BE} \quad \text{(eq. 1)}$$

$$V_{OL}=V_{DD}-V_{BE}I_{Diff}(R_{49}) \quad \text{(eq. 2)}$$

Referring to FIG. 3, an improved output driver 30 is presented. Specifically, driver 30 includes not only first and second drive transistors 32 and 34, differentially coupled bipolar transistors 36 and 38, and resistor pair 50 and 54, but also includes a pair of diode-connected transistors 42 and 44, and associated resistors 46 and 48 connected in parallel between resistor pairs 50 through 56. Resistors 50, 52, 54 and 56 are shown connected between a positive power supply $V_{DD}$ and respective collectors of npn transistors 36 and 38. If transistor 38 is conducting, and transistor 36 is non-conducting, then current $I_{DIFF}$ will produce a voltage through resistor 50 and 52. If driver 30 is operating at temperatures where $V_{BE}$ required for significant current flow is relatively large, then the voltage developed across resistor 50 will not be sufficient to turn on the diode connected transistor 44, and the current through resistor 50 will be essentially $I_{DIFF}$. But as temperature rises and $V_{BE}$ decreases, the voltage across resistor 50 will be enough to create a current flow through resistor 54, transistor 44 and resistor 48. Accordingly, the diode-connected transistor 44 will be forward biased causing current $I_T$ to flow through resistor 54 and resistor 48. Current $I_T$ will add to current $I_{ON}$ through resistor 50 to equal $I_{DIFF}$.

Depending on which of the differential pair of transistors 36 and 38 are on, the current through resistors 50 and 52, and 54 and 56 determine the output logic levels ($V_{OL}$ and $V_{OH}$) at the emitter terminals of transistors 32 and 34. For example, if input INA' causes transistor 38 to turn on, then the base voltage upon transistor 32 is at a logic low level. The result of a logic low level at the base of transistor 32 is a logic level low ($V_{OL}$) at output OUTA. The level of $V_{OL}$ is, however, dependent upon the amount of current ION through resistor 50. If the current which is diverted from one side to the other (i.e., current $I_T$) increases, $I_{ON}$ will decrease. The result of a decreasing $I_{ON}$ is to lower the voltage across resistor 50, and thereby raise the voltage at the base of transistor 32. This results in an increase in $V_{OL}$. The converse is true with respect to $V_{OH}$. Specifically, an increase in $I_T$ will cause a decrease at the base of transistor 34, and therefore a decrease of $V_{OH}$ at output signal OUTA'. The relationship between $V_{BE}$ and $V_{OH}$, as well as $V_{OL}$ for driver 30 shown in FIG. 3 is: as $V_{BE}$ decreases, $V_{OH}$ and $V_{OL}$ increases. However, the diverted current $I_T$ compensates for the decreasing $V_{BE}$ so that it will cause $V_{OH}$ to decrease and $V_{OL}$ to increase. Thus, diverting current will offset the increasing $V_{OH}$.

Diverting current $I_T$ must therefore be carefully regulated to establish output high ($V_{OH}$) values at or near a midscale voltage of the maximum and minimum output high values. That is, current $I_T$ must be adjusted so that $V_{OH}$ values fall within a specified or pre-defined maximum and minimum amounts required by the manufacturer for a particular application. For example, transmitter part no. CY7B923 requires for proper, discernible output values, that $V_{OH}$ maximum and minimum values fall within the range of $V_{DD}$–0.83 and $V_{DD}$–1.03, respectively. Likewise, the specified $V_{OL}$ values should not exceed the maximum of $V_{DD}$–1.62 and the minimum of $V_{DD}$–1.86.

While the diverting current helps compensate for a decrease in $V_{BE}$ by offsetting the increasing $V_{OH}$, its effect on $V_{OL}$ is to further increase it. It is therefore necessary to utilize yet another compensating mechanism to offset the increasing $V_{OL}$. To compensate for current lost through resistor 50 when transistor 38 is on and when $V_{BE}$ decreases, additional current must be sourced by current source 40. An increase in $I_{DIFF}$ dependent upon $V_{BE}$ is, however, difficult to achieve and implement since a temperature-compensating current source is not always accurate across the entire temperature range.

An explanation of the mechanism by which $V_{OH}$ and $V_{OL}$ is established can, alternatively, be described in a mathematical sense. If transistor 36 is off, and diverted current $I_T$ is present through a forward biased diode-connected transistor 44, then $V_{OH}$ is as follows:

$$V_{OH} = V_{DD} - V_{BE} - I_T(R_{54}) \quad \text{(eq. 3)}$$

Similarly, transistor 38 being on will produce $V_{OL}$ at the output of transistor 32 as follows:

$$V_{OL} = V_{DD} - I_{DIFF} R_{52} - (I_{DIFF} - I_T) R_{50} - V_{BE} \quad \text{(eq. 4)}$$

From equations one and two, it is recognized that both $V_{OH}$ and $V_{OL}$ are not only dependent upon the diverted current $I_T$, but also upon $V_{BE}$ of the respective output drive transistors 32 and 34. In addition, for low swing output drivers, the swing amounts may not be sufficient to turn on the diode-connected transistors 42 and 44. Yet further, the differential configuration shown in FIGS. 2 and 3 cannot compensate for single ended PECL outputs without adding deleterious compensation to the other half (second end of the complementary set). To help rectify these problems, a circuit is needed to provide better compensation for changes in $V_{BE}$. It would be desirable that an improved PECL output driver be derived which does not rely upon tail current or cross coupling of the differential stage's load resistors. Furthermore, the improved output driver circuit must produce output logic levels $V_{OL}$ and $V_{OH}$ which are not dependent whatsoever upon $V_{BE}$, or the need for varying a current source to compensate for changes in $V_{BE}$.

SUMMARY OF THE INVENTION

The problems outlined above are in large part solved by an improved PECL output driver circuit. The present circuit comprises an output driver coupled with a $V_{BE}$ sensing/correction circuit (henceforth "correction circuit"). The correction circuit replicates or mimics changes in $V_{BE}$, and produces a corresponding current from the replicated $V_{BE}$ value. Thus, if $V_{BE}$ decreases, the resulting current will also decrease. Current produced from the correction circuit leads to a compensating current which is mirrored possibly in scaled form to the output driver circuit. The compensating current is forwarded through a resistor coupled to a base of a drive transistor. The drive transistor produces the output logic level (either $V_{OH}$ or $V_{OL}$) from the output driver. Compensating current forwarded through the resistor coupled to the drive transistor base varies in proportion to changes in the replicated $V_{BE}$ to offset changes in $V_{BE}$ of the drive transistor. Accordingly, as $V_{BE}$ decreases within the drive transistor, the compensating current will correspondingly and automatically increase to maintain a constant output logic level.

This approach will equally apply to a CMOS circuit with source follower output configurations in which the output voltage levels must be maintained constant across temperature and process variations. In such a case, the correction circuit will replicate changes in the $V_{GS}$ of the output source follower device(s). The rest of the circuit will function as described above for the PECL output driver.

Beneficially, the compensating current maintains $V_{OH}$ and $V_{OL}$ within a specified range regardless of changes in temperature and processing conditions to which and from which the output drive transistor is exposed or produced, respectively. The present output driver circuit is therefore considered to have two circuits which, according to one embodiment, includes the correction circuit and the actual drive transistors. The correction circuit produces a compensating current from a voltage produced across a replicating transistor. The voltage may be placed across a correction resistor to produce a scaled compensating current. The scaled compensating current is represented as a difference between current produced by a current source operably coupled to the output of an operational amplifier and a current forwarded through the correction resistor.

The output driver circuit further includes a current mirror which mirrors the scaled compensating current from the correction circuit to resistors coupled at the base terminals of a pair of output drive transistors. The mirrored current will be forwarded to a pair of differential input transistors. The amount of scaling depends upon a ratio of resistor values, and is approximately the ratio of the correction resistor value to the respective resistor coupled at the base terminal of the corresponding output drive transistor. Scaling serves to minimize power consumption within the correction circuit. Thus, the scaled compensating current is a factor m less than the compensating current forwarded through the resistor at the drive transistor base terminal.

Broadly speaking, the present invention concerns an output driver circuit. The driver circuit comprises a first drive transistor having an emitter and a base. A first resistor is coupled to the base of the first drive transistor. The first resistor is adapted to receive a compensating current which produces a voltage through the first resistor that varies in proportion to changes in the base-to-emitter forward bias voltage $V_{BE}$ of the first drive transistor. A second drive transistor may also be provided having an emitter and a base. A second resistor is coupled to the base of the second drive transistor, through which another compensating current can be forwarded to produce a voltage that varies in proportion to changes in the $V_{BE}$ of the second drive transistor.

The present invention yet further concerns a transmitter. The transmitter can transmit any signal, possibly a clocking signal sent to a local load device, or a communications signal forwarded across, for example, a serial link. The transmitter comprises an output driver which includes a pair of bipolar transistors. The transistors produce, during operation, a corresponding pair of complementary output voltage values. Each of the complementary output voltage values transitions between a pair of pre-defined voltage ranges and remains within the pre-defined voltage ranges between transitions regardless of changes in $V_{BE}$ of the pair of bipolar transistors.

The present invention yet further concerns a method of compensating for changes in $V_{BE}$ within a drive transistor. The method comprises replicating the $V_{BE}$ of the drive transistor. The replicated $V_{BE}$ is then converted into a compensating current. The compensating current is then forwarded to a resistor coupled to the base of the drive transistor to counter any changes in the $V_{BE}$ within the drive transistor.

BRIEF DESCRIPTION OF THE DRAWINGS

Other objects and advantages of the invention will become apparent upon reading the following detailed description and upon reference to the accompanying drawings in which.

Figure 1:
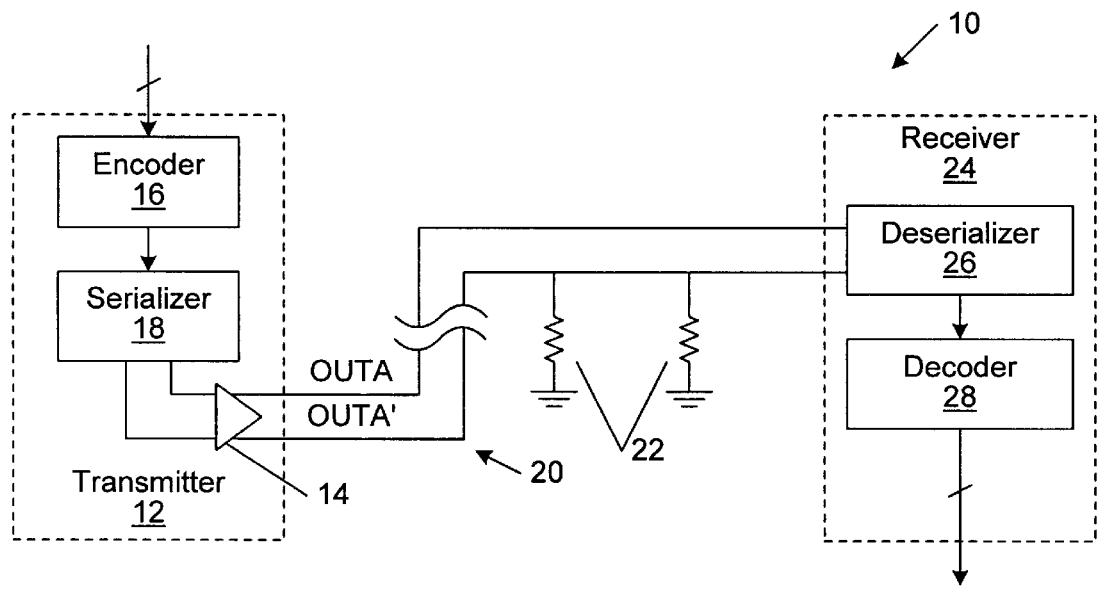
FIG. 1 is a block diagram of a communication system having a transmitter coupled by a serial link to a receiver.
Figure 2:
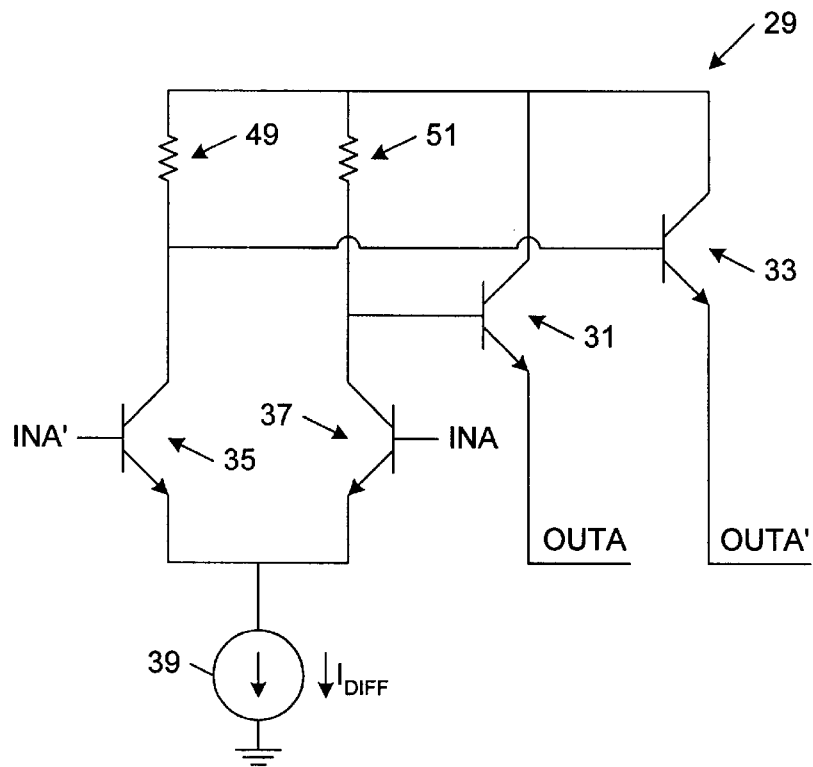
FIG. 2 is a circuit diagram of an output driver potentially used within the transmitter of FIG. 1.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
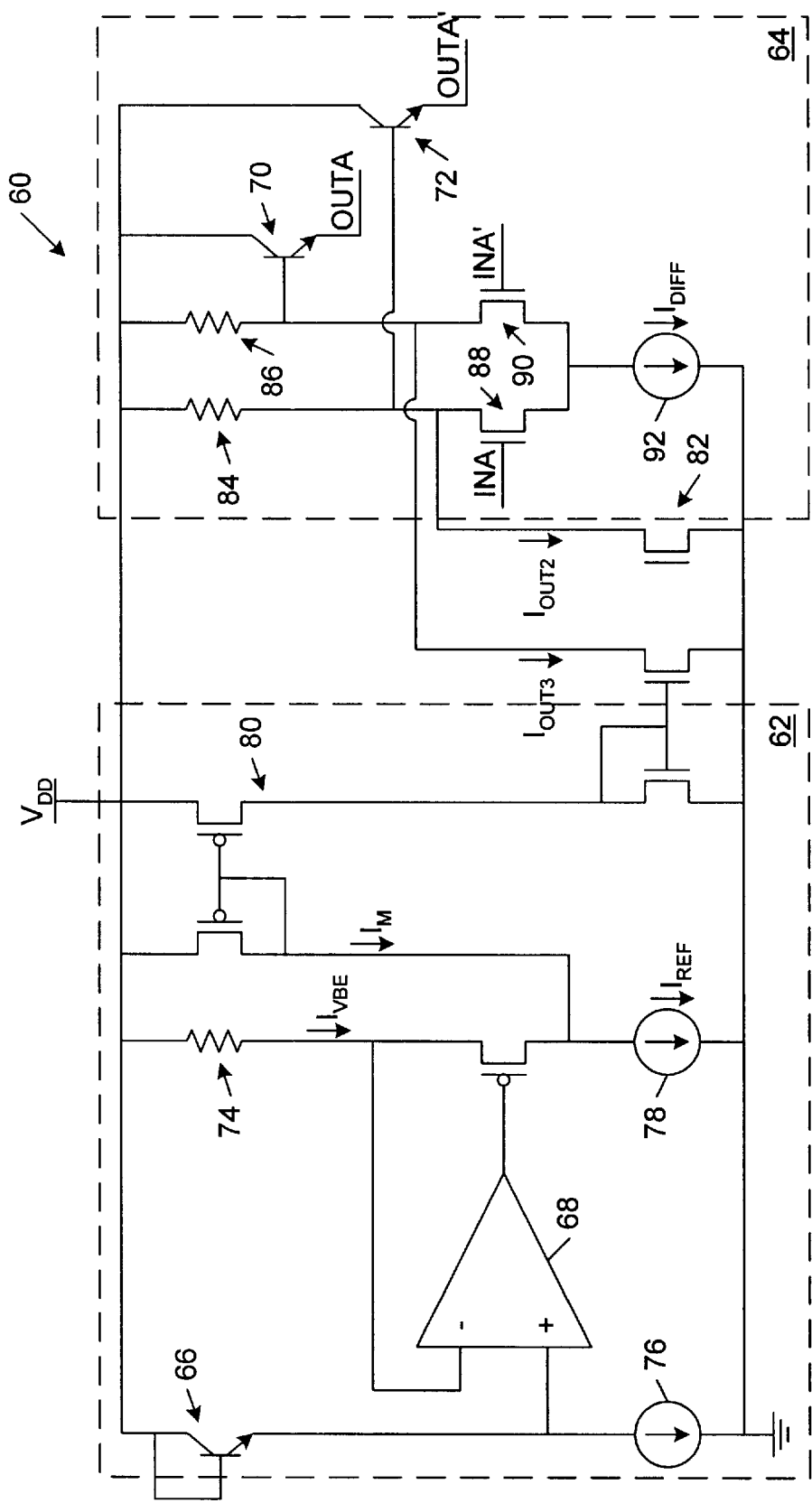
FIG. 4 is a circuit diagram of an output driver according to one exemplary embodiment of the present invention.

Turning to FIG. 4, a circuit diagram of an output driver 60 is shown according to one embodiment of the present invention. Driver 60 includes a correction circuit portion 62 and a selectable drive portion 64. Beginning with correction circuit portion 62, a replicating transistor 66 is provided between the power supply and a non-inverting input of operational amplifier 68. Since driver 60 is formed on a monolithic substrate, and since transistor 66 is dimensioned and concurrently formed with drive transistors 70 and 72 of output drive portions 64, transistor 66 has the same performance characteristics as transistors 70 and 72. More importantly, transistor 66 demonstrates the same $V_{BE}$ as transistor 70 and 72 since it is exposed to the same temperature and the same processing parameters as those transistors. Thus, a voltage $V_{BE}$ is produced across transistor 66 since the collector and base terminals are connected. Amplifier 68 assures the voltage across transistor 66 is isolated from yet mimicked across correction resistor 74.

Current within current source 76 assures a constant current draw across transistor 66 at all times. The replicated voltage placed across resistor 74 corresponds to voltage across transistor 66. Current source 78 produces a current $I_{REF}$ which is equal to a predefined voltage $V_{REF}$ divided by a resistance value within source 78. For reasons explained below, $V_{REF}$ is set approximately near or at a midscale voltage between the maximum and minimum values for $V_{BE}$.

By setting $V_{REF}$ at a midscale value, and defining the resistance of source 78 also at a pre-defined amount, a constant $I_{REF}$ will be produced which equals the sum of $I_{VBE}$ and $I_M$. $I_{VBE}$ is equal to the replicated $V_{BE}$ divided by the value of resistor 74. $I_{REF}$ is preferably defined to exceed $I_{VBE}$ so that current $I_M$ exists when $V_{BE}$ is less than $V_{REF}$, and is represented as a scaled compensating current. $I_M$ is mirrored by current mirrors 80 and 82 to current $I_{OUT2}$ and $I_{OUT3}$. Transistors within current mirror 80 are preferably smaller than the mirror transistors of current mirror 82. Likewise, correction resistor 74 is larger than first and second resistors 84 and 86 of driver portion 64. The ratio of resistor values between correction resister 74 and first resistor 84 or second resistor 86 produces a scale factor m. Scale factor m defines an integer difference between current $I_M$ and current $I_{OUT2}$ or $I_{OUT3}$. For example, m can equal 32, whereby $I_{OUT3}$ is 32 times the amount of $I_M$. Likewise, current $I_{OUT2}$ is 32 times current $I_M$. Scaling helps minimize power consumption and die area within correction circuit portion 62.

Driver portion 64 includes a differential pair of input transistors 88 and 90 which, when active in a complementary fashion, produce a current $I_{DIFF}$ from source 92 through respective resistors 84 or 86. For example, if input signal INA' is at a high logic level, then transistor 90 will turn on causing a combination of $I_{DIFF}$ and $I_{OUT3}$ through second resistor 86. Absent $I_{DIFF}$ through transistor 88 will ensure that only $I_{OUT2}$ will exist through first resistor 84. A combination of $I_{DIFF}$ and $I_{OUT3}$ will produce a substantial voltage drop through second resistor 86.

The output logic levels $V_{OH}$ and $V_{OL}$ upon drive transistor 70 and 72 remain independent of changes in $V_{BE}$ within those transistors. Any change in $V_{BE}$ within transistors 70 and 72 is compensated by a variable $I_{OUT}$ ($I_{OUT2}$ or $I_{OUT3}$) within the first or second resistors 84 and 86. Thus, $I_{OUT}$ is deemed a compensating current. If $V_{BE}$ produced by replication transistor 66 is larger than $V_{REF}$, no correction will be necessary and the scaled compensation current $I_M$ as well as the compensating current $I_{OUT}$ will be zero. If, however, $I_{BE}$ produced within the replication transistor 66, as mimicked upon transistor 70 and 72, is less than $I_{REF}$, then the scaled compensating current $I_M$ will be proportional to $V_{REF}-V_{BE}$. This translates to, or is mirrored to, the compensating current $I_{OUT}$. The compensated current $I_{OUT}$ is deemed to correct both $V_{OH}$ and $V_{OL}$ to offset $V_{BE}$ variations within transistors 70 and 72 (as well as transistor 66), those variations being a result of process skews and temperature changes since compensating current $I_{OUT}$ is generated from $V_{BE}$. A diverting current is not needed, and diversion of that current from one side of the differential transistor pair to the other is no longer necessary.

Replication transistor 66, in combination with the current source 76, are chosen to provide similar current density from the collector to the emitter of transistor 66 as would be expected from transistor 70 or 72. Therefore, $V_{BE}$ of transistor 66 will be approximately equal to $V_{BE}$ of the drive transistor 70 or 72. The resulting current across resistor 74 is as follows:

$$I_{VBE}=V_{BE}/R_{74} \quad \text{(eq. 5)}$$

Figure 3:
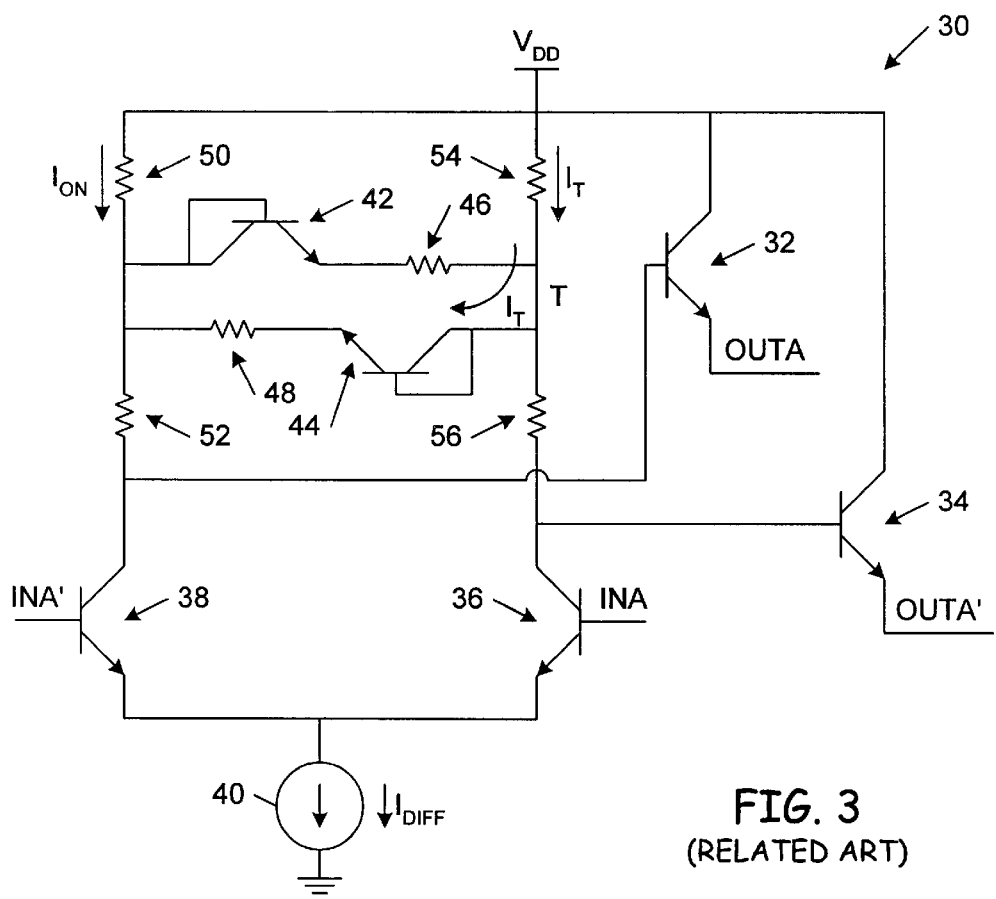
FIG. 3 is a circuit diagram of another type output driver potentially used within the transmitter of FIG. 1.
Figure 5:
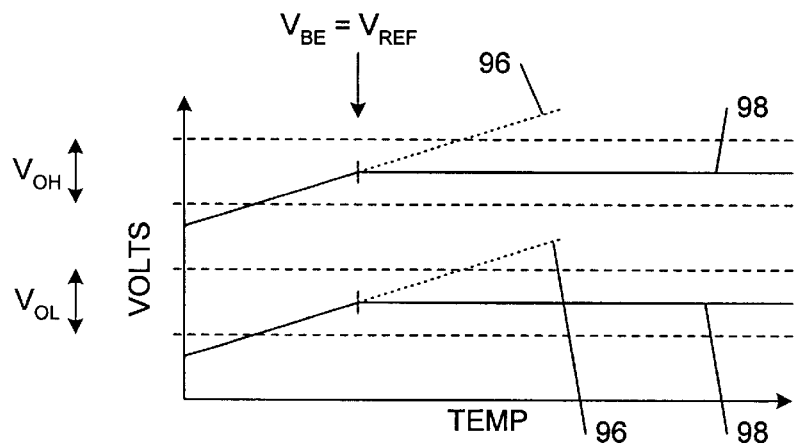
FIG. 5 is a graph of output logic levels forwarded from the output driver which remain relatively constant whenever the temperature increases beyond a specific temperature and, more specifically, the output logic level is shown to remain relatively constant whenever the base-to-emitter voltage ($V_{BE}$) of the output drive transistors decrease below a reference voltage ($V_{REF}$)

To establish a reference voltage $V_{REF}$ from which point corrections start, it is beneficial to review FIGS. 3 through 5 in combination. Current $I_{REF}$ is subtracted from $I_{VBE}$, and the result is applied to the input of the p-channel current mirror 80. Since mirror 80 can only source current, $I_{VBE}$ is limited by $I_{REF}$. If $I_{VBE}$ tries to increase above $I_{REF}$, the scaled compensating current $I_M$ will be zero. Thus, the following equations apply:

$$I_M=0, \text{ if } V_{BE} \text{ is greater than } V_{REF} \quad \text{(eq. 6)}$$

$$I_M=I_{REF}-I_{VBE}=(V_{REF}-V_{BE})/R_{74}, \text{ if } V_{BE} \text{ is less than } V_{REF} \quad \text{(eq 7)}$$

Since compensating current $I_{OUT2}$ and $I_{OUT3}$ are scaled versions of $I_M$, where the scale factor "m" is equal to a ratio of $R_{74}$ divided by $R_{84}$ or $R_{86}$, the resulting correction voltage across first and second resistors 84 and 86 is:

$$V_C=I_{OUT2}R_{84}=mI_MR_{84}=0, \text{ if } V_{BE} \text{ is greater than } V_{REF} \quad \text{(eq. 8)}$$

$$V_C=I_{OUT2}R_{84}=mI_MR_{84}=m(V_{REF}-V_{BE})R_{84}/R_{74}=V_{REF}-V_{BE}, \text{ if } V_{BE} \text{ is less than } V_{REF} \quad \text{(eq. 9)}$$

The correct voltage amounts shown in equations 6 and 7 are deemed compensation voltages at the output of first and second drive transistors 70 and 72. Assuming first transistor 72 produces $V_{OH}$ when transistor 88 is off, $V_{OH}$ can be defined as follows:

$$V_{OH}=V_{DD}-V_{BE}-I_{OUT2}(R_{84}) \quad \text{(eq. 10)}$$

which reduces to:

$$V_{OH}=V_{DD}-V_{BE}-(V_{REF}-V_{BE}) \text{ as set forth above,}$$

and which further reduces to:

$$V_{OH}=V_{DD}-V_{REF} \text{ if } V_{BE} \text{ is less than } V_{REF}$$

It is important to note that $V_{OH}$ is no longer dependent upon $V_{BE}$ and is solely dependent upon pre-defined power and reference voltages.

With regard to $V_{OL}$, if transistor 70 produces $V_{OL}$ when transistor 90 is on, then the resulting $V_{OL}$ on output OUTA is as follows:

$$V_{OL}=V_{DD}-V_{BE}-I_{DIFF}(R_{86})-I_{OUT3}(R_{86}) \quad \text{(eq. 11)}$$

which reduces to:

$$V_{OL}=V_{DD}-(V_{REF}-V_{BE})$$

and which further reduces to:

$$V_{OL}=V_{DD}-V_{REF}-I_{DIFF}(R_{86}) \text{ if } V_{BE} \text{ is less than } V_{REF}.$$

From the above, it is noted that $V_{OL}$, like $V_{OH}$, is no longer dependent upon change in $V_{BE}$. Instead, $V_{OL}$ depends only upon power supply voltage, a pre-defined and maintained reference voltage, and a pre-defined and maintained current source ($I_{DIFF}$)

FIG. 5 illustrates a reference voltage $V_{REF}$ established so that correction starts near a mid-scale between the maximum and minimum $V_{OH}$ and $V_{OL}$ ranges. For example, if $V_{OH}$ is between $V_{DD}-0.83$ and $V_{DD}-1.03$, then $V_{REF}$ may be established to start correction at $V_{DD}-0.93$. Likewise, if $V_{OL}$ maximum and minimum values are $V_{DD}-1.62$ and $V_{DD}-1.86$, then $V_{REF}$ may be selected so that $I_{REF}$ and $I_{VBE}$ are equal at the temperature where $V_{OL}$ is at $V_{DD}-1.74$ (i.e., midscale).

Figure 6:
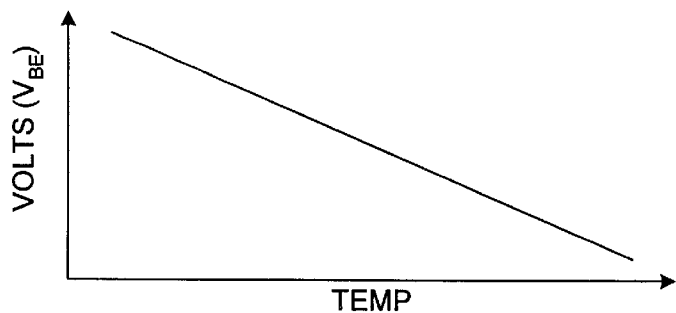
FIG. 6 is a graph of $V_{BE}$ decreasing with increase in temperature.

As shown in FIGS. 5 and 6, if $V_{BE}$ decreases as a result of increase in temperature, the decrease will cause an increase in both $V_{OH}$ and $V_{OL}$ up until $V_{BE}$ reaches $V_{REF}$. At temperatures beyond the point at which $V_{BE}$ reaches $V_{REF}$, compensation occurs as denoted by the difference between lines 96 and 98. Line 96 illustrates no compensation, and line 98 indicates compensation. Line 98 thereby depicts the advantages of compensation and the benefit of maintaining $V_{OH}$ and $V_{OL}$ levels near the midscale between the maximum and minimum specified values regardless of changes in $V_{BE}$ brought about by change in temperature or process skews.

While the invention has been particularly shown and described with reference to a preferred embodiment, it will be understood by those skilled in the art that various changes in form and detail may be made therein without departing from the spirit and scope of the invention.

What is claimed is:

1. An output driver circuit, comprising:
   a first drive transistor having an emitter and a base; and
   a first resistor coupled to the base of the first drive transistor, wherein said first resistor is adapted to receive a compensating current which produces a voltage through the first resistor, and wherein the voltage produced through the first resistor offsets changes in low and high output voltage levels caused by changes in the base-to-emitter forward bias voltage of the first drive transistor.

2. The output driver circuit as recited in claim 1, wherein the voltage produced through the first resistor is a correction portion of the voltage which is proportional to a reference voltage minus the base-to-emitter forward bias voltage, and wherein the reference voltage is at approximately a midscale voltage of the base-to-emitter forward bias voltage.

3. The output driver circuit as recited in claim 1, further comprising a sense correction circuit which includes a current source and a correction resistor, and wherein the correction circuit produces a scaled said compensating current as a difference between current produced by the current source and current forwarded through the correction resistor of which a voltage across the correction resistor substantially matches the first drive transistor base-to-emitter forward bias voltage.

4. The output driver circuit as recited in claim 3, wherein the scaled said compensating current is a factor m less than said compensating current.

5. The output driver circuit as recited in claim 4, wherein said m is a ratio of said correction resistor and said first resistor.

6. The output driver circuit as recited in claim 3, wherein the correction circuit further includes a current mirror coupled to mirror the scaled said compensating current to the compensating current.

7. The output driver circuit as recited in claim 1, further comprising:
   a second drive transistor having an emitter and a base; and
   a second resistor coupled to the base of the second drive transistor, wherein said second resistor is adapted to receive another compensating current which produces a voltage through the second resistor that varies in proportion to changes in the base-to-emitter forward bias voltage of the second drive transistor.

8. The output driver circuit as recited in claim 7, wherein the second drive transistor operably produces an output which is at a logic value that is a complement of a logic value produced at the output of the first drive transistor.

9. A transmitter, comprising an output driver which includes a pair of bipolar transistors that produce, during operation, a corresponding pair of differential output voltage values from the transmitter, each of said differential output voltage values transitioning between a pair of pre-defined voltage ranges and remaining within the predefined voltage ranges between transitions regardless of changes in a base-to-emitter forward bias voltage of the pair of bipolar transistors, wherein said transmitter is biased using a current source substantially invariant to said changes in the base-to-emitter forward bias voltage.

10. The transmitter as recited in claim 9, wherein changes in the base-to-emitter forward bias voltage result from changes in a temperature to which the pair of bipolar transistors is subjected.

11. The transmitter as recited in claim 10, wherein changes in the base-to-emitter forward bias voltage result from changes in fabrication parameters used to produce the pair of bipolar transistors.

12. The transmitter as recited in claim 9, wherein said base-to-emitter forward bias voltage is a voltage which, when exceeded, causes current to flow from the base to the emitter.

13. The transmitter as recited in claim 9, wherein said pair of differential output voltage values comprise a first voltage value and a second voltage value, and wherein said first voltage value is at a binary logic level dissimilar from the second voltage value.

14. A method of compensating for changes in a base-to-emitter forward bias voltage within a drive transistor, comprising:
   continuously replicating the base-to-emitter forward bias voltage of the drive transistor whenever power is supplied to a circuit containing the drive transistor;
   converting the replicated base-to-emitter forward bias voltage into a compensating current; and
   forwarding the compensating current to a resistor coupled to the base of the drive transistor to counter said changes in the base-to-emitter forward bias voltage within the drive transistor.

15. The method as recited in claim 14, wherein said converting comprises:
   presenting the replicated base-to-emitter forward bias voltage across a correcting resistor to produce a current;
   subtracting from a current sourced amount from the current to produce a remainder current; and
   scaling the remainder current into said compensating current.

16. The method as recited in claim 15, wherein said scaling comprises mirroring the remainder current to an increased quantity upon the resistor coupled to the base of the driver transistor.

17. The method as recited in claim 14, wherein said forwarding comprises presenting to the resistor a compensating current that is a function of the replicated base-to-emitter forward bias voltage and a pre-defined reference voltage.

18. The method as recited in claim 17, wherein said reference voltage is approximately at a midscale voltage output high level to which the drive transistor is defined to produce.

19. An output driver circuit, comprising:
   a first drive transistor having source and a gate; and
   a first resistor coupled to the gate of the first drive transistor, wherein said first resistor is adapted to receive a compensating current which produces a voltage through the first resistor that varies in proportion to changes in the gate-to-source voltage of the first drive transistor.

* * * * *